US006730620B2

(12) United States Patent
Miyazaki et al.

(10) Patent No.: US 6,730,620 B2
(45) Date of Patent: May 4, 2004

(54) SUBSTRATE PROCESSING METHOD AND SUBSTRATE PROCESSING APPARATUS

(75) Inventors: Kei Miyazaki, Kikuyo-Machi (JP); Yuichiro Uchihama, Kikuyo-Machi (JP); Kenji Yasuda, Kikuyo-Machi (JP); Kiminari Sakaguchi, Kikuyo-Machi (JP); Shinji Nagashima, Kikuyo-Machi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/134,483

(22) Filed: Apr. 30, 2002

(65) Prior Publication Data

US 2002/0119678 A1 Aug. 29, 2002

Related U.S. Application Data

(62) Division of application No. 09/661,309, filed on Sep. 13, 2000, now Pat. No. 6,413,317.

(30) Foreign Application Priority Data

Sep. 14, 1999 (JP) .......................................... 11-259895
Sep. 14, 1999 (JP) .......................................... 11-260431

(51) Int. Cl.$^7$ ............................................. H01L 21/26
(52) U.S. Cl. .................. 438/795; 438/761; 438/769; 438/782; 438/783; 438/787; 438/788
(58) Field of Search ................................ 438/795, 782, 438/769, 761, 787, 788, 783

(56) References Cited

U.S. PATENT DOCUMENTS

| 5,229,081 A | 7/1993 | Suda ........................... 427/186 |
| 5,622,607 A | 4/1997 | Yamazaki et al. ...... 204/192.15 |
| 6,274,516 B1 * | 8/2001 | Kamei et al. ................ 438/782 |
| 6,475,930 B1 * | 11/2002 | Junker et al. ................ 438/787 |

FOREIGN PATENT DOCUMENTS

| JP | 11-274148 | 10/1999 |
| JP | 2000-124206 | 4/2000 |

* cited by examiner

Primary Examiner—David Nelms
Assistant Examiner—Reneé R. Berry
(74) Attorney, Agent, or Firm—Rader, Fishman & Grauer PLLC

(57) ABSTRACT

Processing of applying ultraviolet rays to a front face of an insulating film material formed on a wafer W is performed, whereby a contact angle of the front face thereof becomes smaller. Accordingly, when an insulating film material is applied on the aforesaid front face, the material smoothly spreads, and projections and depressions never occur on a front face of an upper layer insulating film material. Thereby, it is possible to form the insulating film thick and flatter on a substrate.

11 Claims, 14 Drawing Sheets

SUBSTRATE PROCESSING METHOD AND SUBSTRATE PROCESSING APPARATUS

This application is a divisional of patent application Ser. No. 09/661,309 filed Sep. 13, 2000 now U.S. Pat. No. 6,413,317.

BACKGROUND OF THE INVENTION

1. Field of the Invention

The present invention is included in a technical field of semiconductor device fabrication and the like, and more specifically, relates to a substrate processing method and a substrate processing apparatus for performing, for example, processing by ultraviolet rays for a front face of an insulating film material applied on a substrate.

2. Description of the Related Art

In processes of semiconductor device fabrication, a layer insulating film is formed, for example, by an SOD (Spin on Dielectric) system. In this SOD processing system, a layer insulating film is formed by coating a wafer with a coating film while spinning the wafer and performing chemical processing, heat processing, or the like for the wafer by means of a sol-gel process, a silk method, a speed film method, a fox method, or the like.

When a layer insulating film is formed by the sol-gel process, for example, first an insulating film material, for example, a solution in which colloids of TEOS (tetraethoxysilane) are dispersed in an organic solvent is supplied onto a semiconductor wafer (hereinafter referred to as "wafer"). Thereafter, the wafer to which the solution is supplied is subjected to gelling processing, and then solvents are exchanged. Subsequently, the wafer on which solvents are exchanged undergoes heat processing.

In order to form the layer insulating film, for example, thick and flat on the wafer, application of about two to three coats of an insulating film material on the wafer is conventionally performed. However, the front face of the insulating film material after the application is generally large in contact angle, and thus there is a problem that when an insulating film material is further applied on the front face of the insulating film material, a front face of an upper layer insulating film material becomes uneven.

SUMMARY OF THE INVENTION

The present invention is made under the aforesaid circumstances and an abject thereof is to provide a substrate processing method and a substrate processing apparatus capable of forming an insulating film thick and flatter on a substrate.

Another object of the present invention is to provide a substrate processing method and a substrate processing apparatus capable of efficiently making a front face of an insulating film material smaller in contact angle.

To solve the aforesaid problem, according to a first aspect of the present invention, a substrate processing method, comprising the steps of: applying an insulating film material on a substrate; performing processing by ultraviolet rays for a front face of the applied insulating film material; and further applying an insulating film material on the applied insulating film material after the ultraviolet-ray processing step, is provided.

According to the above configuration, processing by ultraviolet rays, for example, processing including ultraviolet-ray irradiation is performed for the front face of the insulating film material, whereby the contact angle of the front face becomes smaller. Therefore, when an insulating film material is applied on the aforesaid front face by, for example, spin coating, the material smoothly spreads, and projections and depressions never occur on a front face of an upper layer insulating film material. Consequently, it is possible to form the insulating film thick and flatter on the substrate.

According to a second aspect of the present invention, a substrate processing method, comprising the steps of: applying an insulating film material on a substrate; applying ultraviolet rays to a front face of the insulating film material in an inert gas atmosphere; and thereafter bringing an atmosphere over the insulating film material to an oxygen atmosphere, is provided.

According to the above configuration, processing by ultraviolet rays, for example, processing including ultraviolet-ray irradiation is performed for the front face of the insulating film material, whereby the contact angle of the front face becomes small. Therefore, when a material of some kind is applied on the aforesaid front face by, for example, spin coating, the material smoothly spreads, and projections and depressions never occur on a front face of the material.

According to a third aspect of the present invention, a substrate processing apparatus, comprising: a holding plate for holding a substrate; an ultraviolet-ray irradiation lamp disposed above the holding plate for applying ultraviolet rays to a front face of the substrate; means for bringing a portion between the substrate held on the holding plate and the ultraviolet-ray irradiation lamp to an inert gas atmosphere; and means for switching at least the inert gas atmosphere over the front face of the substrate held on the holding plate to an oxygen atmosphere, is provided.

In the above configuration, the portion between the substrate held on the holding plate and the ultraviolet-ray irradiation lamp is brought into the inert gas atmosphere, ultraviolet rays are applied onto the substrate from the ultraviolet-ray irradiation lamp, and thereafter the inert gas atmosphere over the front face of the substrate is switched to the oxygen atmosphere, so that a front face of an insulating film can be efficiently made smaller in contact angle.

According to a fourth aspect of the present invention, a substrate processing apparatus, comprising: a holding plate for holding a substrate and ascendable and descendable between a first area and a second area below the first area; a vertically driving mechanism for vertically driving the holding plate between the first area and the second area; an ultraviolet-ray irradiation lamp disposed above the holding plate for applying ultraviolet rays to a front face of the substrate held by the holding plate; means for blasting an inert gas toward the first area; and means for blasting oxygen gas toward the second area, is provided.

According to the above configuration, the inert gas atmosphere can be switched to the oxygen atmosphere only by lowering the substrate from the first area to the second area, and the oxygen atmosphere can be switched to the inert gas atmosphere only by raising the substrate from the second area to the first area. Consequently, a front face of an insulating film can be efficiently made smaller in contact angle by raising and lowering the substrate above the holding plate.

According to a fifth aspect of the present invention, a substrate processing apparatus, comprising: a holding plate for holding a substrate to be ascendable and descendable between a first area and a second area below the first area;

a vertically driving mechanism for vertically driving the substrate held by the holding plate between the first area and the second area; an ultraviolet-ray irradiation lamp disposed above the holding plate for applying ultraviolet rays to a front face of the substrate held by the holding plate; means for blasting an inert gas toward the first area; and means for blasting oxygen gas toward the second area, is provided.

According to the above configuration, the inert gas atmosphere can be switched to the oxygen atmosphere only by lowering the holding plate holding the substrate from the first area to the second area, and the oxygen atmosphere can be switched to the inert gas atmosphere only by raising the holding plate from the second area to the first area. Consequently, a front face of an insulating film can be efficiently made smaller in contact angle by raising and lowering the holding plate.

According to a sixth aspect of the present invention, a substrate processing apparatus, comprising: a holding plate for holding a substrate and rotatable; a rotationally driving mechanism for rotationally driving the holding plate; an ultraviolet-ray irradiation lamp, disposed above the holding plate along at least a radial direction of rotation of the holding plate, for applying ultraviolet rays to the substrate held by the holding plate; an inert gas blast portion, disposed along one side of the ultraviolet-ray irradiation lamp, for blasting an inert gas toward the front face of the substrate held on the holding plate; and an oxygen gas blast portion, disposed along the other side of the ultraviolet-ray irradiation lamp, for blasting oxygen gas toward the front face of the substrate held on the holding plate, is provided.

According to the above configuration, when the holding plate is rotated, the inert gas is first blasted to the front face of the substrate held on the holding plate, whereby the front face of the substrate is brought into the inert gas atmosphere and then irradiated with ultraviolet rays. Thereafter, the oxygen gas is blasted to the front face of the substrate, whereby the front face of the substrate is brought into the oxygen atmosphere. The holding plate is continuously rotated, whereby the aforesaid operations are repeated. Consequently, a front face of an insulating film can be efficiently made smaller in contact angle.

These objects and still other objects and advantages of the present invention will become apparent upon reading the following specification when taken in conjunction with the accompanying drawings.

DETAILED DESCRIPTION OF THE PREFERRED EMBODIMENT

Hereinafter, a first embodiment of the present invention will be described with reference to the drawings.

Figure 1:
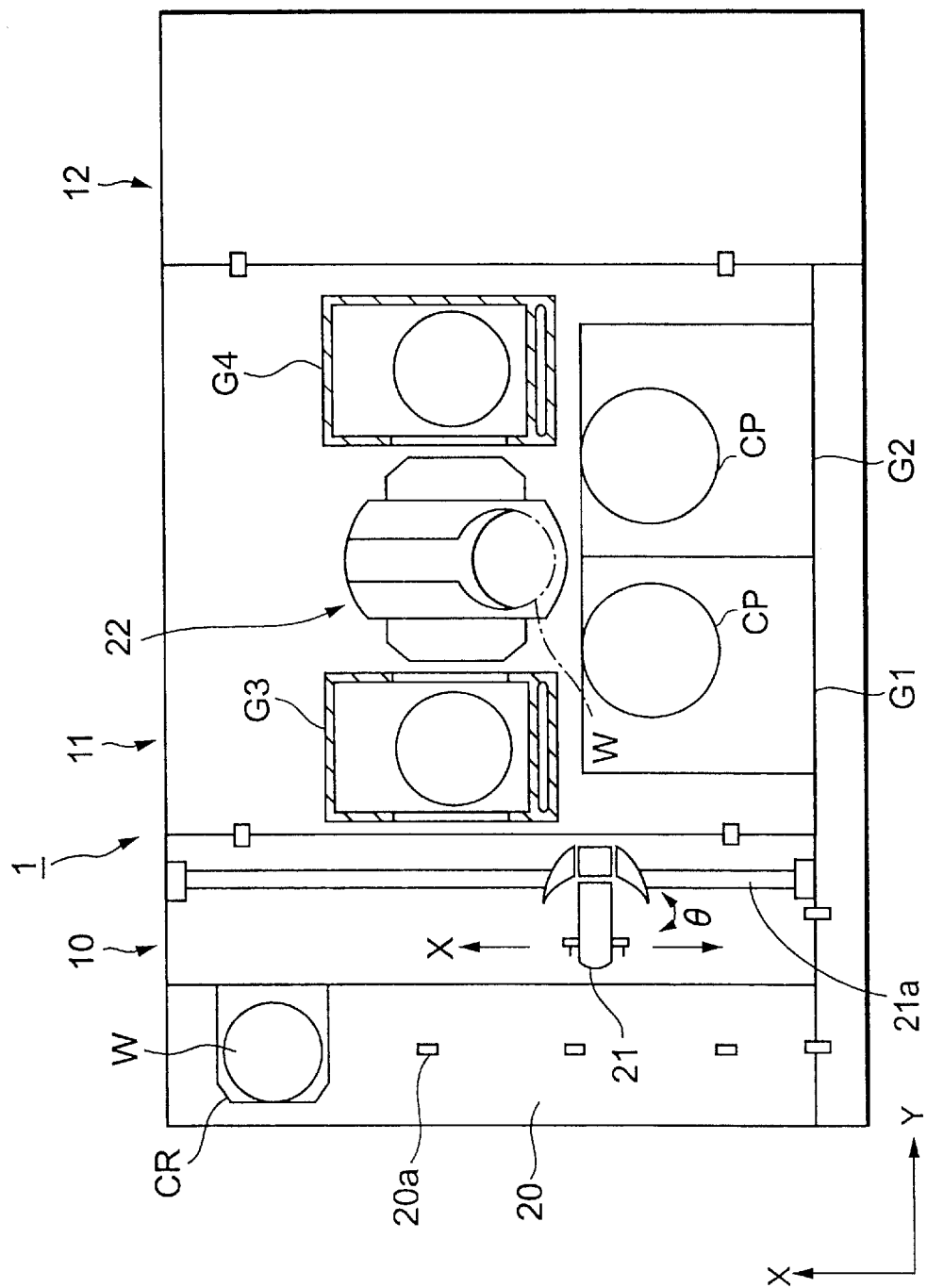
FIG. 1 is a plan view of an SOD processing system according to an embodiment of the present invention.
Figure 2:
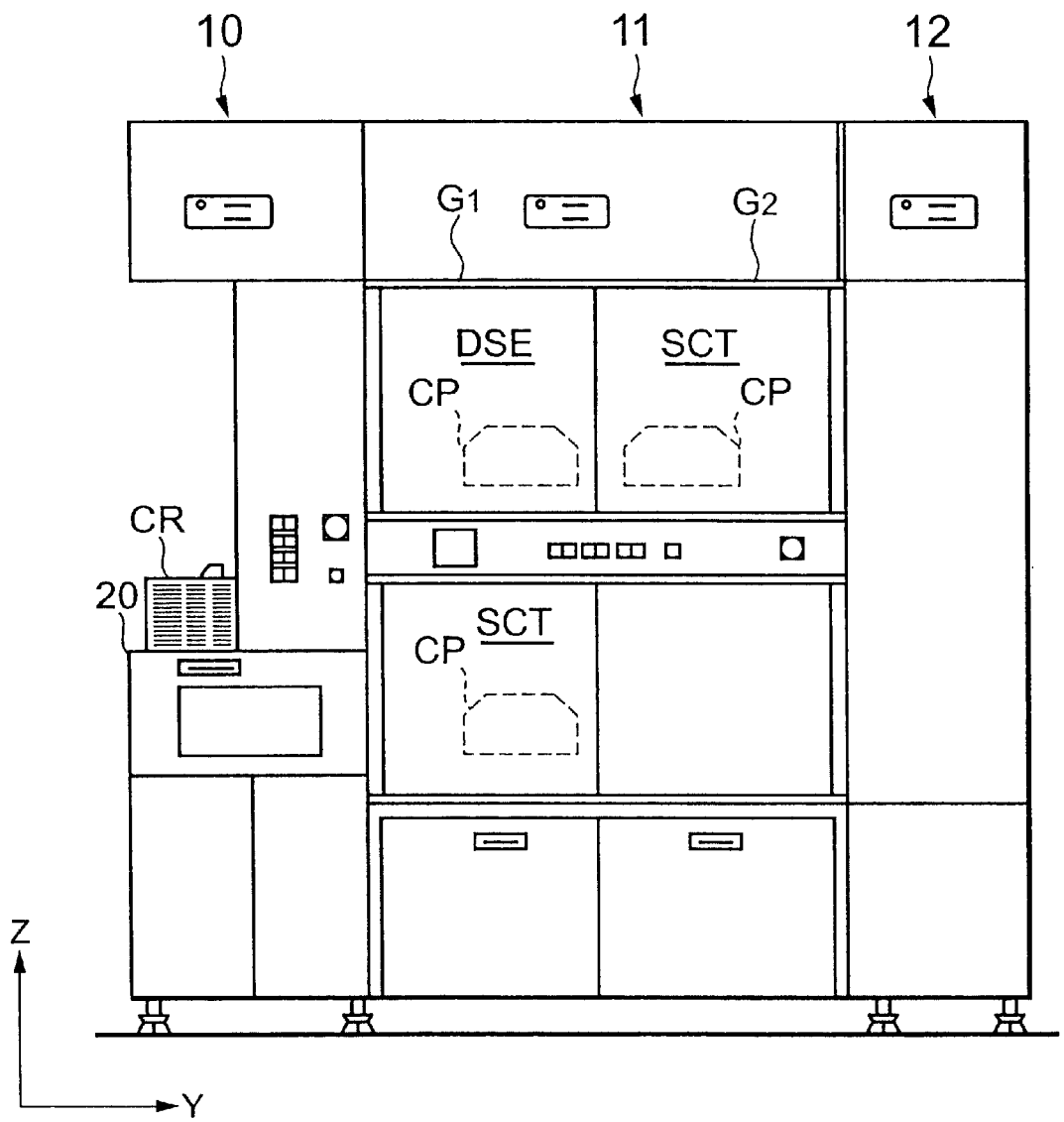
FIG. 2 is a front view of the SOD processing system shown in FIG. 1.
Figure 3:
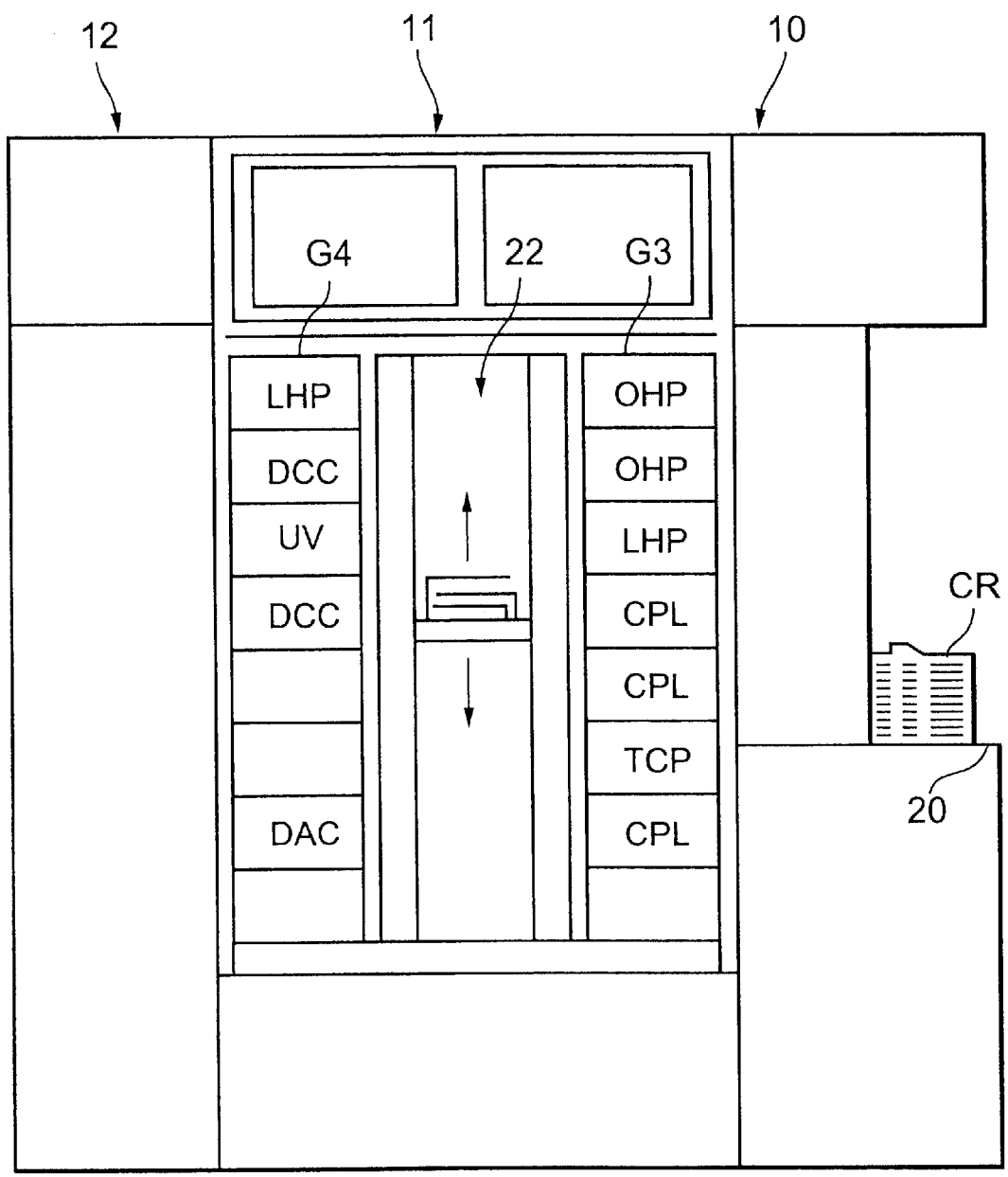
FIG. 3 is a rear view of the SOD processing system shown in FIG. 1.

In this first embodiment, a substrate processing method of the present invention is applied to an SOD (Spin on Dielectric) processing system for forming a layer insulating film on a wafer. FIG. 1 to FIG. 3 are views showing the entire structure of the SOD processing system, FIG. 1 is a plan view, FIG. 2 is a front view, and FIG. 3 is a rear view.

The SOD processing system 1 has a structure in which a cassette block 10 for transferring a plurality of, for example, 25 semiconductor wafers (hereinafter, referred to as wafers) W as substrates, as a unit, in a wafer cassette CR from/to the outside into/from the system and carrying the wafer W into/out of the wafer cassette CR, a processing block 11 in which various kinds of processing stations each for performing predetermined processing for the wafers W one by one in an SOD coating process are multi-tiered at predetermined positions, and a cabinet 12 in which a bottle of ammonia water, a bubbler, a drain bottle, and the like required in an aging process are provided are integrally connected.

In the cassette block 10, as shown in FIG. 1, a plurality of, for example, up to four wafer cassettes CR are mounted with respective wafer transfer ports facing the processing block 11 side at positions of projections 20a on a cassette mounting table 20 in a line in an X-direction. A wafer transfer body 21 movable in the direction of arrangement of cassettes (the X-direction) and in the direction of arrangement of wafers housed in the wafer cassette CR (a Z-vertical direction) selectively gets access to each of the wafer cassettes CR. The wafer transfer body 21 is structured to be rotatable in a θ-direction so as to be accessible to a transfer and chill plate (TCP) included in a multi-tiered station section of a third group G3 on the processing block 11 side as will be described later.

In the processing block 11, as shown in FIG. 1, a vertical transfer-type main wafer transfer mechanism 22 is provided at the central portion thereof. Around the main wafer transfer mechanism 22, all processing stations composing one group or a plurality of groups are multi-tiered. In this embodiment, four groups G1, G2, G3, and G4 each having multi-tiered stations are arranged. Multi-tiered stations of the first and second groups G1 and G2 are arranged side by side on the front side of the system (the lower side in FIG. 1), multi-tiered stations of the third group G3 are arranged adjacent to the cassette block 10, and multi-tiered stations of the fourth group G4 are arranged adjacent to the cabinet 12.

As shown in FIG. 2, in the first group G1, an SOD coating processing station (SCT) for supplying an insulating film material while the wafer W is mounted on a spin chuck in a cup CP and applying a uniform insulating film material on the wafer by rotating the wafer and a solvent exchange processing station (DSE) for supplying chemicals for exchange such as HMDS, heptane, and the like while the wafer W is mounted on a spin chuck in a cup CP and exchanging a solvent in the insulating film applied on the wafer for another solvent prior to a drying process are two-tiered from the bottom in order.

In the second group G2, an SOD coating processing station (SCT) is arranged at the upper tier. Incidentally, it is possible to arrange an SOD coating processing station (SCT), a solvent exchange processing station (DSE), or the like at the lower tier of the second group G2 if necessary.

As shown in FIG. 3, in the third group G3, two low-oxygen and high-temperature heat processing stations (OHP), a low-temperature heat processing station (LHP), two cooling processing stations (CPL), a transfer and chill plate (TCP), and a cooling processing station (CPL) are multi-tiered from the top in order. The low-oxygen and high-temperature heat processing station (OHP) here has a hot plate on which the wafer W is mounted inside a sealable processing chamber, exhausts air from the center of the top portion of the processing chamber while $N_2$ is being discharged uniformly from holes at the outer periphery of the hot plate, and performs high-temperature heat processing for the wafer W in a low-oxygen atmosphere. The low-temperature heat processing station (LHP) has a hot plate on which the wafer W is mounted and performs low-temperature heat processing for the wafer W. The cooling processing station (CPL) has a chill plate on which the wafer W is mounted and performs cooling processing for the wafer W. The transfer and chill plate (TCP) has a two-tiered structure with a chill plate for cooling the wafer W at the lower tier and a delivery table at the upper tier and performs transfer of the wafer W between the cassette block 10 and the processing block 11.

In the fourth group G4, a low-temperature heat processing station (LHP), a low-oxygen curing and cooling processing station (DCC), an ultraviolet-ray processing station (UV) according to the present invention, a low-oxygen curing and cooling processing station (DCC), and an aging processing station (DAC) are multi-tiered from the top in order. The low-oxygen curing and cooling processing station (DCC) here has a hot plate and a chill plate such that they are adjacent to each other inside a sealable processing chamber, and performs high-temperature heat processing for the wafer W in the low-oxygen atmosphere in which exchange for $N_2$ is performed and performs cooling processing for the wafer W which has been subjected to the heat processing. The aging processing station (DAC) introduces a processing gas ($NH_3+H_2O$) made by mixture of ammonia gas and water vapor into a sealable processing chamber to perform aging processing for the wafer W, thereby wet-gelling an insulating film material on the wafer W. The ultraviolet-ray processing station (UV) will be described later. The ultraviolet-ray processing station (UV) is disposed between two low-oxygen curing and cooling processing stations (DCC), whereby the inside of the station can be kept at a stable temperature.

Figure 4:
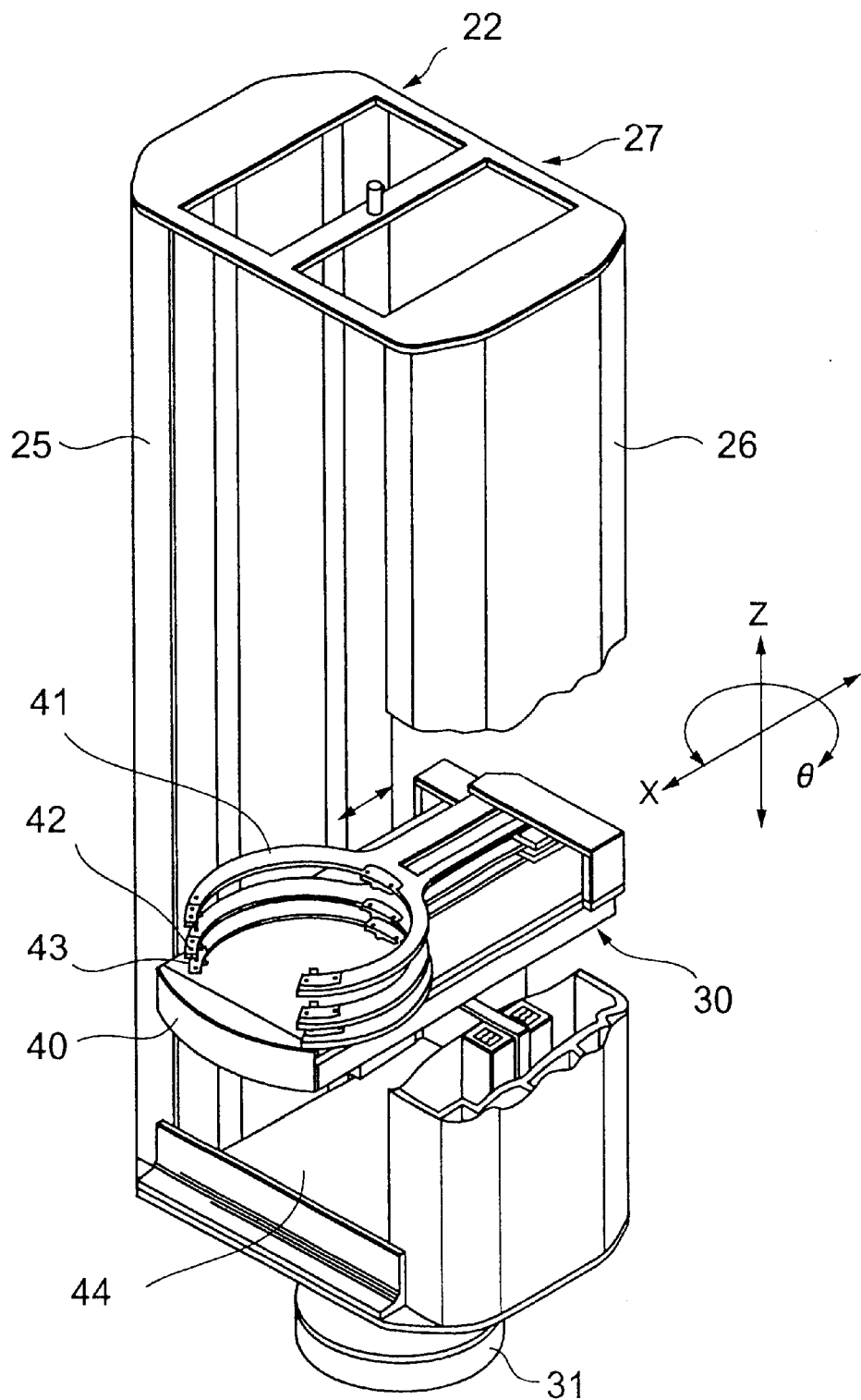
FIG. 4 is a perspective view of a main wafer transfer mechanism in the SOD processing system shown in FIG. 1.

FIG. 4 is a perspective view showing the appearance of the main wafer transfer mechanism 22. This main wafer transfer mechanism 22 is provided with a wafer transfer device 30 which is ascendable and descendable in the vertical direction (the Z-direction) inside a cylindrical supporter 27 composed of a pair of wall portions 25 and 26 which are connected with each other at respective upper ends and lower ends and face each other. The cylindrical supporter 27 is connected to a rotating shaft of a motor 31 and rotates integrally with the wafer transfer device 30 around the aforesaid rotating shaft by rotational driving force of the motor 31. Accordingly, the wafer transfer device 30 is rotatable in the θ-direction. For example, three tweezers are provided on a transfer base 40 of the wafer transfer device 30. These tweezers 41, 42, and 43 each have a shape and a size capable of freely passing through a side opening 44 between both the wall portions 25 and 26 of the cylindrical supporter 27 so as to be movable back and forth along the X-direction. The main wafer transfer mechanism 22 allows the tweezers 41, 42, and 43 to get access to processing stations disposed thereabout to transfer the wafer W from/to these processing stations.

It should be noted that this SOD processing system 1 is placed in a clean room by way of example, and an atmosphere over the main wafer transfer mechanism 22 is set at, for example, a pressure higher than that of the clean room which is set at atmospheric pressure, thereby ejecting particles which occur above the main wafer transfer mechanism 22 to the outside of the SOD processing system 1 and additionally preventing particles in the clean room from entering the SOD processing system 1.

Figure 11:
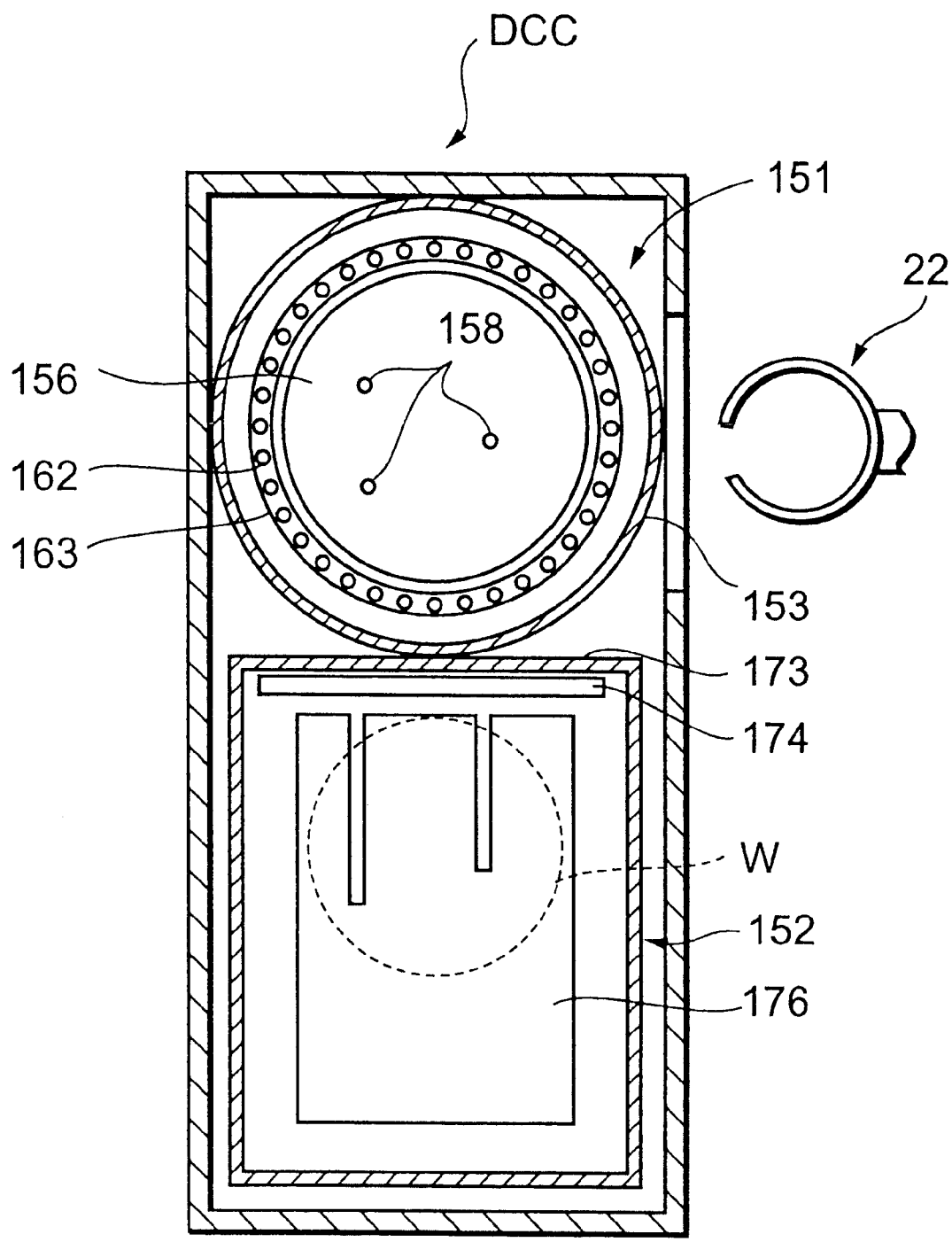
FIG. 11 is a plan view of a low-oxygen curing and cooling processing station.
Figure 12:
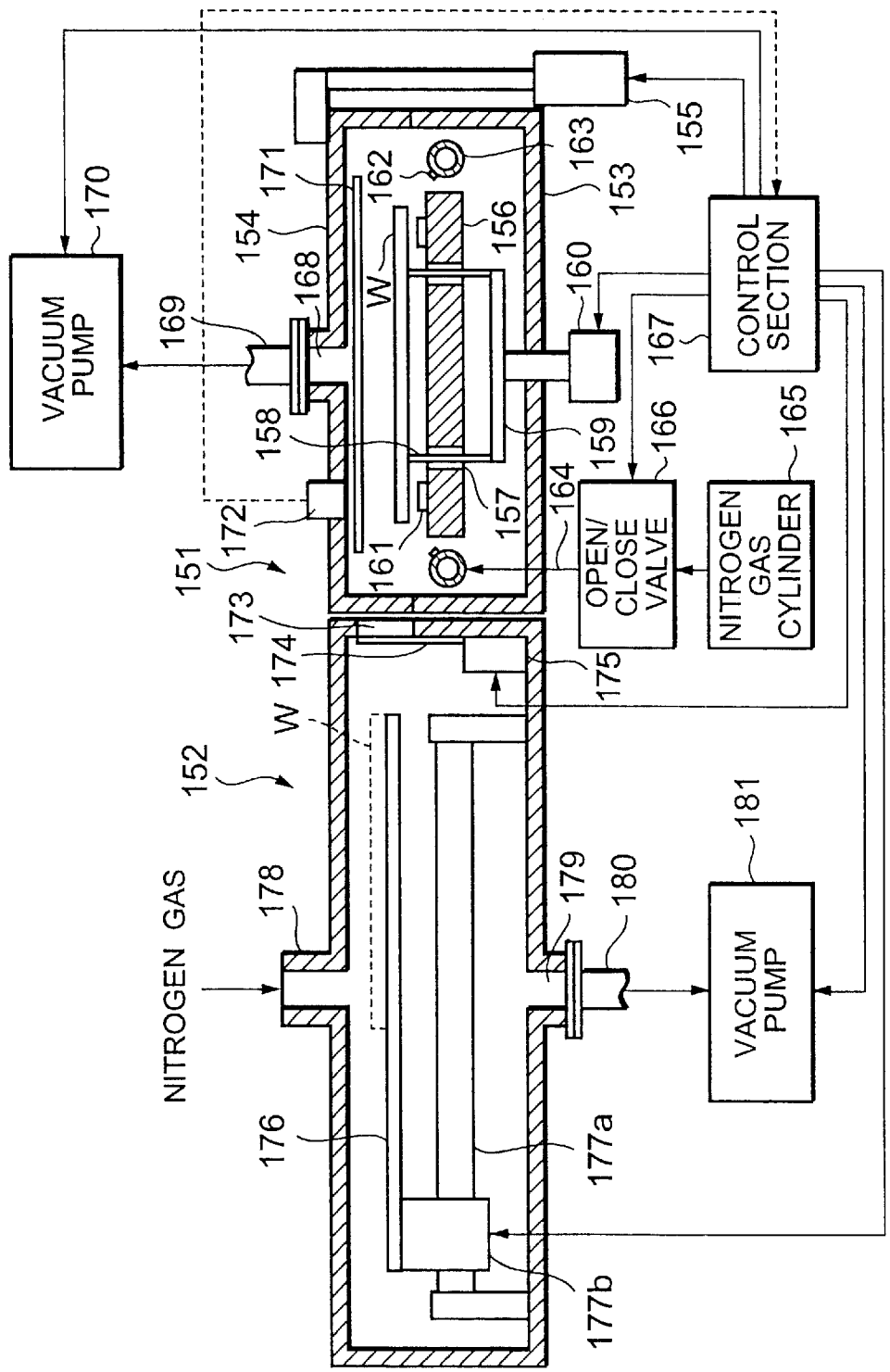
FIG. 12 is a sectional view of the low-oxygen curing and cooling processing station shown in FIG. 11.

FIG. 11 is a plan view showing the structure of the low-oxygen curing and cooling processing station (DCC) having a heat processing chamber and a cooling processing chamber, and FIG. 12 is a sectional view thereof.

The low-oxygen curing and cooling processing station (DCC) includes a heat processing chamber 151 and a cooling processing chamber 152 which is provided adjacent to the heat processing chamber 151.

The heat processing chamber 151 includes a processing chamber main body 153 of which the top portion is opened and a lid body 154 disposed to be ascendable and descendable so as to open and close the top opening portion of the processing chamber main body 153. A raising and lowering cylinder 155 is connected with the lid body 154, so that the lid body 154 is raised and lowered by drive of the raising and lowering cylinder 155. The top opening portion of the processing chamber main body 153 is closed with the lid body 154, whereby a sealed space is formed in the heat processing chamber 151. Further, delivery of the wafer W is performed between the heat processing chamber 151 and the main wafer transfer mechanism 22 and between the heat processing chamber 151 and the cooling processing chamber 152 with the top portion of the processing chamber main body 153 being opened.

A hot plate 156 for performing heat processing for the wafer W is disposed nearly at the central portion of the processing chamber main body 153. In the hot plate 156, for example, a heater (not shown) is embedded, and the set temperature thereof can be, for example, 200° C. to 470° C. Further, a plurality of, for example, three holes 157 concentrically and vertically penetrate the hot plate 156, and support pins 158 for supporting the wafer W are inserted in the holes 157 to be ascendable and descendable. The support pins 158 are connected to a communicating member 159 into one body under the rear face of the hot plate 156, and the communicating member 159 is raised and lowered by a raising and lowering cylinder 160 disposed thereunder. The support pins 158 protrude and retract from the front face of the hot plate 156 by raising and lowering operation of the raising and lowering cylinder 160.

Moreover, a plurality of proximity pins 161 are disposed on the front face of the hot plate 156, thereby preventing the wafer W from directly contacting the hot plate 156 when heat processing is performed for the wafer W. Thereby, electrostatic is prevented from building up in the wafer W during the heat processing.

Furthermore, a ring pipe 163 provided with a large number of gas blast ports 162 for supplying an inert gas, for example, nitrogen gas ($N_2$) into the heat processing chamber 151 is disposed to surround the periphery of the hot plate 156. This ring pipe 163 is connected to a nitrogen gas cylinder 165 via a pipe 164, and an open/close valve 166 is placed on the pipe 164, and the open/close valve 166 is configured such that its opening and closing is controlled by a control section 167. It should be noted that not only an inert gas, but also another gas, for example, oxygen gas may be supplied into the heat processing chamber 151 as required. In that case, it is possible to supply these gasses via a switching valve for switching between nitrogen gas and oxygen gas sharing the ring pipe 163. Thereby, upsizing of the heat processing chamber can be avoided.

Meanwhile, an exhaust port 168 for reducing pressure is provided nearly at the central portion of the lid body 154, and the exhaust port 168 is connected to a vacuum pump 170 via a flexible hose 169 by way of example. By operation of the vacuum pump 170, the inside of the heat processing chamber 151 can be set at a pressure lower than atmospheric pressure, for example, about 0.1 torr.

Further, a current plate 171 is disposed inside the lid body 154 to cover the exhaust port 168. The current plate 171 is larger in diameter than the exhaust port 168 and has a clearance of, for example, about 5 mm between the current plate 171 and the inner wall of the lid body 154. By virtue of the arrangement of such a current plate 171, the pressure in the heat processing chamber 151 can be uniformly reduced.

Moreover, attached to the lid body 154 is a pressure sensor 172 for measuring the pressure in the heat processing chamber 151. A measured result by the pressure sensor 172 is reported to the control section 167, and the control section 167 controls the operation of the vacuum pump 170 based on the measured result to thereby keep the inside of the heat processing chamber 151 at a state of a fixed reduced pressure.

The cooling processing chamber 152 is provided with an opening portion 173, facing the heat processing chamber 151, for performing delivery of the wafer W from/to the heat processing chamber 151. The opening portion 173 can be opened and closed by a shutter member 174. The shutter member 174 is raised and lowered for the aforesaid open and close by means of a raising and lowering cylinder 175.

Further, in the cooling processing chamber 152, a chill plate 176 for cooling the wafer W while the wafer W is mounted thereon is configured to be movable in a horizontal direction along a guide plate 177a by means of a moving mechanism 177b. Thereby, the chill plate 176 can get into the heat processing chamber 151 through the opening portion 173, receives the wafer W in the heat processing chamber 151 which has been heated by the hot plate 156 from the support pins 158, carries the wafer W into the cooling processing chamber 152, and returns the wafer W to the support pins 158 after the wafer W is cooled. It should be noted that the set temperature of the chill plate 176 is, for example, 15° C. to 25° C. and an applicable temperature range of the wafer W to be cooled is 200° C. to 470° C.

Furthermore, an inert gas such as nitrogen gas or the like is supplied into the cooling processing chamber 152 from the top thereof via a pipe 178. At the lower portion of the cooling processing chamber 152 provided is an exhaust port 179 which is connected to a vacuum pump 181, for example, via a flexible hose 180. By operation of the vacuum pump 181, the inside of the cooling processing chamber 152 can be set at a pressure lower than atmospheric pressure, for example, about 0.1 torr. Incidentally, the vacuum pump used in the heat processing chamber 151 and the vacuum pump used in the cooling processing chamber 152 may be composed of the same apparatus.

Figure 5:
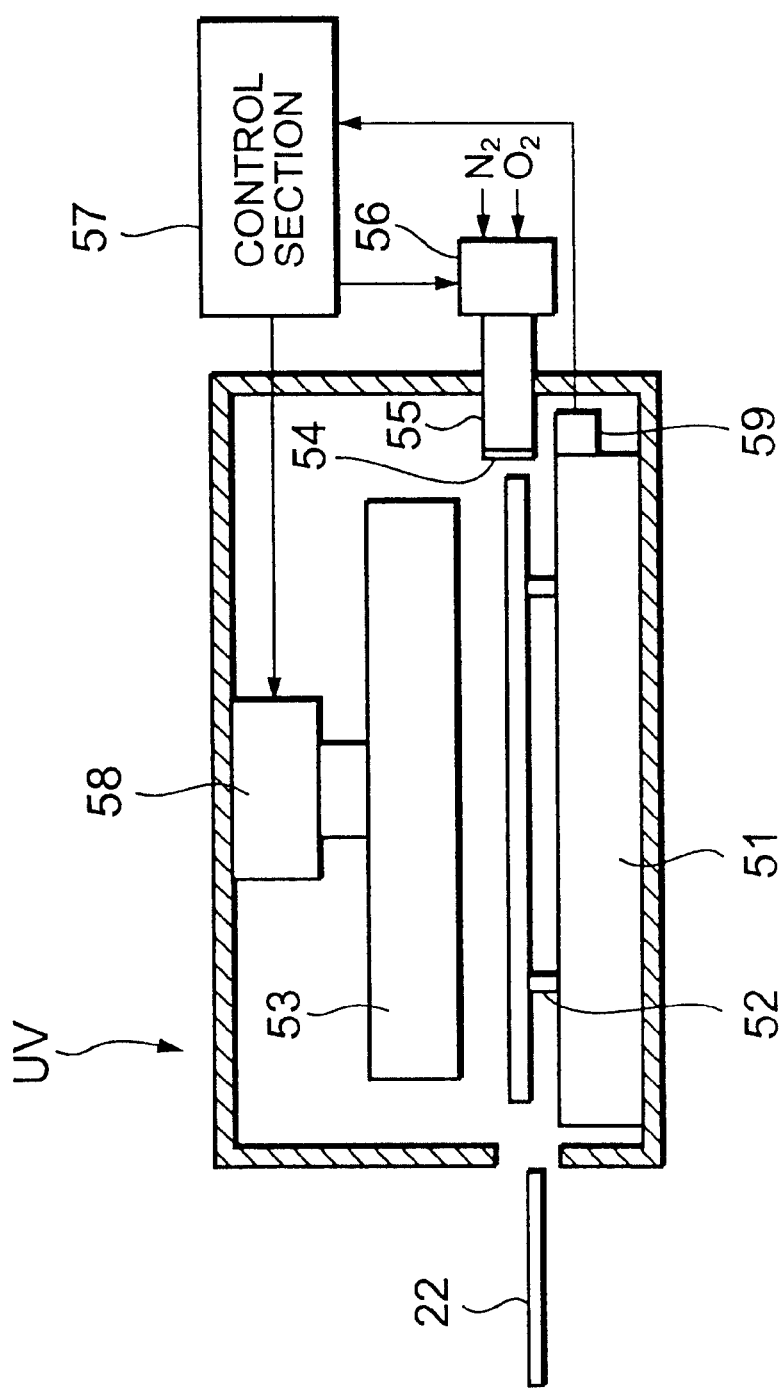
FIG. 5 is a front view showing the structure of an ultraviolet-ray processing station according to a first embodiment of the present invention.

FIG. 5 is a front view showing the structure of the ultraviolet-ray processing station (UV) according to the present invention.

As shown in FIG. 5, in the ultraviolet-ray processing station (UV), a holding plate 51 for holding the wafer W is disposed nearly at the center thereof. The holding plate is provided with a plurality of, for example, three support pins 52. The delivery of the wafer W to/from the tweezers 41, 42, and 43 of the main wafer transfer mechanism 22 is performed on the support pins 52, and the wafer W is subjected to processing by ultraviolet rays while supported by the support pins 52.

An ultraviolet-ray irradiation lamp 53 for applying ultraviolet rays to the front face of the wafer W held by the holding plate 51 is placed above the holding plate 51. On one side of those, disposed is a blast pipe 55 having a blast port 54 for blasting gas toward a clearance between the holding plate 51 and the ultraviolet-ray irradiation lamp 53. A switching valve 56 is connected to the blast pipe 55. The switching valve 56 performs switching for supplying one of nitrogen gas as an inert gas which is supplied from a nitrogen gas cylinder of which the illustration is omitted and oxygen gas which is supplied from an oxygen gas cylinder of which the illustration is omitted to the blast pipe 55 under the control of a control section 57.

Further, a vertically driving mechanism 58 for vertically driving the ultraviolet-ray irradiation lamp 53 is disposed above the ultraviolet-ray irradiation lamp 53, and, for example, an illuminance monitor 59 for monitoring an illuminance of the ultraviolet-ray irradiation lamp 53 is disposed near the holding plate 51. A monitored result by the illuminance monitor 59 is sent to the control section 57, and the control section 57 allows the vertically driving mechanism 58 to raise and lower the ultraviolet-ray irradiation lamp 53 so as to keep the monitored illuminance constant. Thereby, the illuminance of the ultraviolet rays applied to the wafer W can be usually kept constant. It should be noted that such a control of illuminance can be realized by raising and lowering the holding plate 51 and not the ultraviolet-ray irradiation lamp 53.

Figure 6:
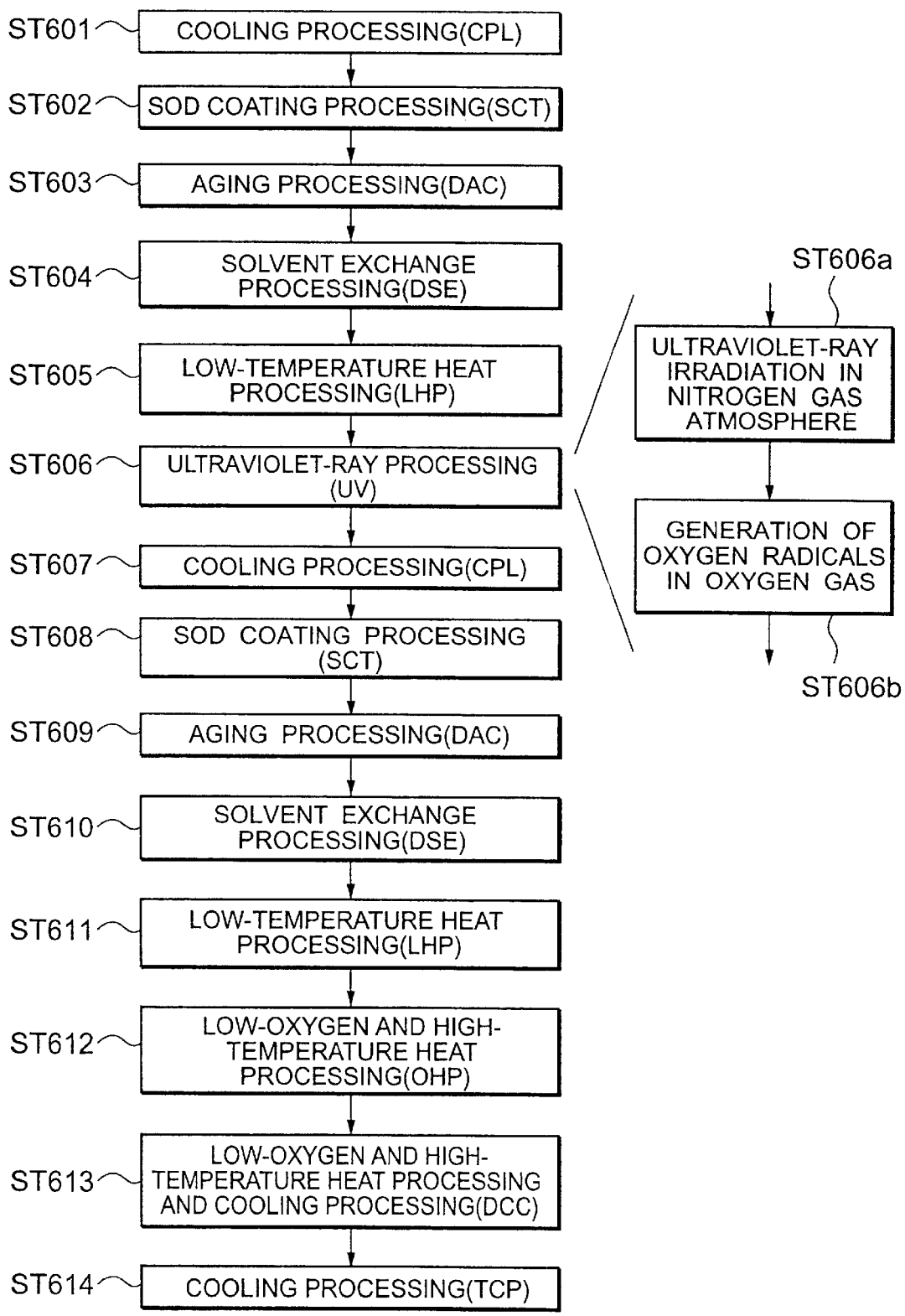
FIG. 6 is a processing flowchart of the SOD processing system shown in FIG. 1.

Next, operations in the SOD processing system 1 thus structured will be explained. FIG. 6 shows a processing flow in this SOD processing system 1.

First, in the cassette block 10, the unprocessed wafer W is transferred from the wafer cassette CR to the delivery table in the transfer and chill plate (TCP) included in the third group G3 on the processing block 11 side by means of the wafer transfer body 21.

The wafer W transferred to the delivery table in the transfer and chill plate (TCP) is transferred to the cooling processing station (CPL) by means of the main wafer transfer mechanism 22. In the cooling processing station (CPL), the wafer W is cooled to a temperature suitable for processing in the SOD coating processing station (SCT) (step 601).

The wafer W which has undergone the cooling processing in the cooling processing station (CPL) is transferred to the SOD coating processing station (SCT) via the main wafer transfer mechanism 22. In the SOD coating processing station (SCT), the wafer W is subjected to SOD coating processing (step 602).

The wafer W which has undergone the SOD coating processing in the SOD coating processing station (SCT) is transferred to the aging processing station (DAC) via the main wafer transfer mechanism 22 and subjected to aging processing, whereby an insulating film material on the wafer W is gelled (step 603).

The wafer W which has undergone the aging processing in the aging processing station (DAC) is transferred to the solvent exchange processing station (DSE) via the main wafer transfer mechanism 22. In the solvent exchange processing station (DSE), a chemical for exchange is supplied to the wafer W and processing for exchanging a solvent in the insulating film applied on top of the wafer for another solvent is performed (step 604).

The wafer W which has undergone the exchange processing in the solvent exchange processing station (DSE) is transferred to the low-temperature heat processing station (LHP) by means of the main wafer transfer mechanism 22. In the low-temperature heat processing station (LHP), the wafer W undergoes low-temperature heat processing (step 605).

The wafer W which has undergone the low-temperature heat processing in the low-temperature heat processing station (LHP) is transferred to the ultraviolet-ray processing station (UV) by means of the main wafer transfer mechanism 22. In the ultraviolet-ray processing station (UV), the wafer W is subjected to processing by ultraviolet rays with a wavelength of about 172 nm (step 606). In this processing by ultraviolet rays, nitrogen gas is first blasted from the blast port 54 of the blast pipe 55, whereby the inside of the ultraviolet-ray processing station (UV) is brought to a nitrogen gas atmosphere, and in that state, ultraviolet rays are applied, for example, for one minute from the ultraviolet-ray irradiation lamp 53 (step 606a). Next, oxygen gas is blasted from the blast port 54 of the blast pipe 55, whereby the inside of the ultraviolet-ray processing station (UV) is brought to an oxygen gas atmosphere, for example, for ten seconds (step 606b). As described above, in this embodiment, ultraviolet rays are applied to the front face of the insulating film material applied on the wafer W in the nitrogen atmosphere, and thereafter the atmosphere over the front face of the insulating film material is brought to an oxygen gas atmosphere to generate oxygen radicals (O*), so that the front face of the insulating film can be efficiently made smaller in contact angle. Incidentally, the above-described step 606a and step 606b may be performed several times. As for the oxygen gas atmosphere here in the present invention, oxygen is suitably contained at least 5% or more in the gas. Though 100% of oxygen gas is used in this embodiment, air can be used instead. Further, the ultraviolet-ray irradiation lamp and the wafer W are separated by about 5 mm in this embodiment.

Thereafter, nitrogen gas is blasted for about 30 seconds from the blast port 54 of the blast pipe 55, whereby the inside of the ultraviolet-ray processing station (UV) is exchanged for a nitrogen gas atmosphere.

The wafer W which has been subjected to the processing by ultraviolet rays is transferred to the cooling processing station (CPL) by means of the main wafer transfer mechanism 22. In the cooling processing station (CPL), the wafer W is cooled (step 607).

The wafer W which has undergone the cooling processing in the cooling processing station (CPL) is transferred again to the SOD coating processing station (SCT) via the main wafer transfer mechanism 22. In the SOD coating processing station (SCT), the wafer W is subjected to a second time of SOD coating processing (step 608). At that time, the front face of the insulating film material which has been already applied on the wafer W is improved in quality so as to be smaller in contact angle by the aforesaid processing by ultraviolet rays, and thus even if an insulating film material is further applied thereon, projections and depressions do not occur on a front face thereof.

The wafer W which has undergone the SOD coating processing in the SOD coating processing station (SCT) is transferred to the aging processing station (DAC) via the main wafer transfer mechanism 22 and subjected to aging processing, whereby the insulating film material on the wafer W is gelled (step 609).

The wafer W which has undergone the aging processing in the aging processing station (DAC) is transferred to the solvent exchange processing station (DSE) via the main wafer transfer mechanism 22. In the solvent exchange processing station (DSE), a chemical for exchange is supplied to the wafer W and processing for exchanging a solvent in the insulating film applied on top of the wafer for another solvent is performed (step 610).

The wafer W which has undergone the exchange processing in the solvent exchange processing station (DSE) is transferred to the low-temperature heat processing station (LHP) by means of the main wafer transfer mechanism 22. In the low-temperature heat processing station (LHP), the wafer W undergoes low-temperature heat processing (step 611).

The wafer W which has undergone the low-temperature heat processing in the low-temperature heat processing station (LHP) is transferred to the low-oxygen and high-temperature heat processing station (OHP) by means of the main wafer transfer mechanism 22. In the low-oxygen and high-temperature heat processing station (OHP), the wafer W undergoes high-temperature heat processing in a low-oxygen atmosphere (step 612).

The wafer W which has undergone the high-temperature heat processing in the low-oxygen and high-temperature heat processing station (OHP) is transferred to the low-oxygen curing and cooling processing station (DCC) by means of the main wafer transfer mechanism 22. In the low-oxygen curing and cooling processing station (DCC), the wafer W undergoes high-temperature heat processing in a low-oxygen atmosphere and then cooling processing (step 613).

Here, the processing in the step 613 will be explained in more detail using FIG. 11 and FIG. 12.

The wafer W is delivered from the main wafer transfer mechanism 22 onto the support pins 58 in a state in which the top portion of the processing chamber main body 153 is opened and the support pins 158 protrude from the front face of the hot plate 156. At that time, nitrogen gas is blasted into the heat processing chamber 151 from the gas blast ports 162 of the ring pipe 163, whereby the inside of the heat processing chamber 151 is set at a pressure higher than a pressure on the main wafer transfer mechanism 22 side. Thereby, it is avoided for particles to be drawn from the main wafer transfer mechanism 22 side into the heat processing chamber 151.

Subsequently, the lid body 154 is lowered and the top opening portion of the processing chamber main body 153 is closed with the lid body 154, thereby forming a sealed space in the heat processing chamber 151. Then, a blast of nitrogen gas into the heat processing chamber 151 from the gas blast ports 162 of the ring pipe 163 is stopped and the vacuum pump 170 is operated to set the inside of the heat processing chamber 151 at a pressure lower than atmospheric pressure, for example, about 0.1 torr. Thereafter, the support pins 158 are lowered and retract from the front face of the hot plate 156, whereby the wafer W is mounted on the hot plate 156 and heat processing for the wafer W is started. Since the wafer W is subjected to the heat processing at a pressure lower than atmospheric pressure in the heat processing chamber 151 as described above, it is possible to quickly perform the heat processing performed for the wafer W and to form a layer insulating film which is high in dielectric constant and is a uniform porous film on the wafer W.

Next, the blast of nitrogen gas is started into the heat processing chamber 151 from the gas blast ports 162 of the ring pipe 163 to purge the inside of the heat processing chamber 151 by the nitrogen gas, the support pins 158 are raised to protrude from the front face of the hot plate 156, and the lid body 154 is raised, whereby the top portion of the processing chamber main body 153 is opened. The blast of the nitrogen gas into the heat processing chamber 151 from the gas blast ports 162 of the ring pipe 163 is continued during that time. Thereby, particles are never drawn from the main wafer transfer mechanism 22 side into the heat processing chamber 151.

Next, the chill plate 176 in the cooling processing chamber 152 gets into the heat processing chamber 151 through the opening portion 173, receives the wafer W from the support pins 158, and carries the wafer W into the cooling processing chamber 152. During that time, nitrogen gas is supplied into the cooling processing chamber 152 through the pipe 178. Thereby, oxidation of the wafer W is prevented. For example, nitrogen gas is supplied to the cooling processing chamber 152 too much to thereby bring the inside of the cooling processing chamber 152 more positive in pressure than the inside of the heat processing chamber 151, whereby it is avoided for particles to be drawn into the cooling processing chamber 152. Contrary to that, nitrogen gas is supplied to the cooling processing chamber 152 too little to thereby bring the inside of the cooling processing chamber 152 more negative in pressure than the inside of the heat processing chamber 151, whereby it is avoided for particles to be drawn into the heat processing chamber 151. In other words, the essence is to control drawing of particles by giving a relation of negative pressure or positive pressure between the heat processing chamber 151 and the cooling processing chamber 152.

Next, the opening portion 173 is closed by the shutter member 174, and the supply of nitrogen gas into the cooling processing chamber 152 is stopped. Further, the inside of the cooling processing chamber 152 is set to a pressure lower than atmospheric pressure by the operation of the vacuum pump 181, and the cooling processing for the wafer W is performed. The cooling processing is performed under the reduced pressure as described above, whereby the cooling processing can be quickly and uniformly performed for the wafer W.

Next, the operation of the vacuum pump 181 is stopped, the supply of nitrogen gas into the cooling processing chamber 152 is started, and the opening portion 173 is opened. The chill plate 176 gets into the heat processing chamber 151 through the opening portion 173 and delivers the wafer W to the support pins 158. At that time, the blast of nitrogen gas into the heat processing chamber 151 from the gas blast ports 162 of the ring pipe 163 is continued. Thereby, particles are never drawn from the main wafer transfer mechanism 22 side into the heat processing chamber 151.

The wafer W which has been subjected to the processing in the low-oxygen curing and cooling processing station (DCC) is transferred to the chill plate in the transfer and chill plate (TCP) by means of the main wafer transfer mechanism 22. The wafer W undergoes cooling processing on the chill plate in the transfer and chill plate (TCP) (step 614). In this embodiment, an insulating film with a thickness of about 500 nm can be obtained by one time of SOD coating processing and thus an insulating film with a thickness of 1 $\mu$m can be obtained by a total of two times of SOD coating processing.

The wafer W which has undergone the cooling processing on the chill plate in the transfer and chill plate (TCP) is transferred to the wafer cassette CR via the wafer transfer body 21 in the cassette block 10.

By the above-described SOD processing, a flat layer insulating film without projections and depressions can be formed on the front face of the wafer W.

Next, a second embodiment of an ultraviolet-ray processing station according to the present invention will be explained.

Figure 7:
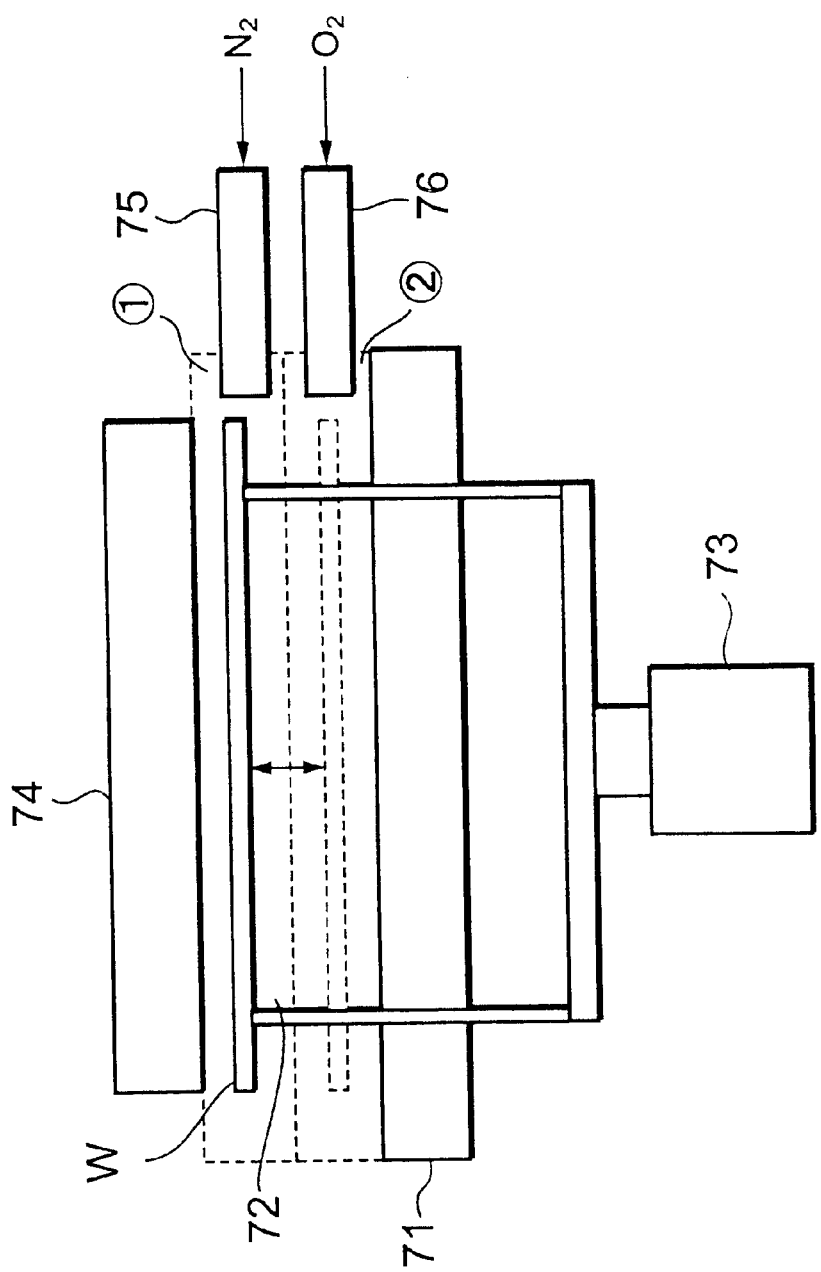
FIG. 7 is a front view showing the structure of an ultraviolet-ray processing station according to a second embodiment of the present invention.

FIG. 7 is a front view showing the structure of the ultraviolet-ray processing station (UV) according to the second embodiment.

In the ultraviolet-ray processing station (UV) shown in FIG. 7, a holding plate 71 for holding the wafer W is disposed nearly at the center thereof. The holding plate 71 is provided with a plurality, for example, three support pins 72. The support pins 72 are configured to be raised and lowered above the holding plate 71 by means of a vertically driving mechanism 73 which is provided on the rear face side of the holding plate 71. Further, an ultraviolet-ray irradiation lamp 74 is disposed above the front face of the wafer W held by the holding plate 71. Here, an area close to the ultraviolet-ray irradiation lamp 74 is regarded as a first area ①, and an area close to the holding plate 71 thereunder is regarded as a second area ②. On one side of these areas, a nitrogen gas blast pipe 75 for blasting nitrogen gas as an inert gas supplied from a nitrogen gas cylinder of which the illustration is omitted toward the first area ① is disposed, and an oxygen gas blast pipe 76 for blasting oxygen gas supplied from an oxygen gas cylinder of which the illustration is omitted toward the second area ② is disposed under the first area ①. Nitrogen gas of low molecular weight is blasted to the first area ① and oxygen gas of high molecular weight is blasted to the second area ② under the first area ① as described above, thereby reducing mixture of nitrogen gas in the first area ① and oxygen gas in the second area ②.

In a state in which the tips of the support pins 72 are within the first area ①, the wafer W is delivered from the tweezers 41, 42, and 43 of the main wafer transfer mechanism 22 to the support pins 72. Then, ultraviolet rays are applied to the front face of the wafer W from the ultraviolet-ray irradiation lamp 74 in the first area ①. Thereafter, the support pins 72 are lowered, whereby the wafer W is moved to the second area ②, and oxygen radicals (O*) are generated in the second area ②. Incidentally, the above-described raising and lowering operation may be repeated twice or more.

As described above, in this embodiment, a nitrogen gas atmosphere can be switched to an oxygen gas atmosphere only by lowering the wafer W from the first area ① to the second area ②, and an oxygen gas atmosphere can be switched to a nitrogen gas atmosphere only by raising the wafer W from the second area ② to the first area ①. Consequently, the front face of the insulating film applied on the wafer W can be efficiently made smaller in contact angle.

Figure 8:
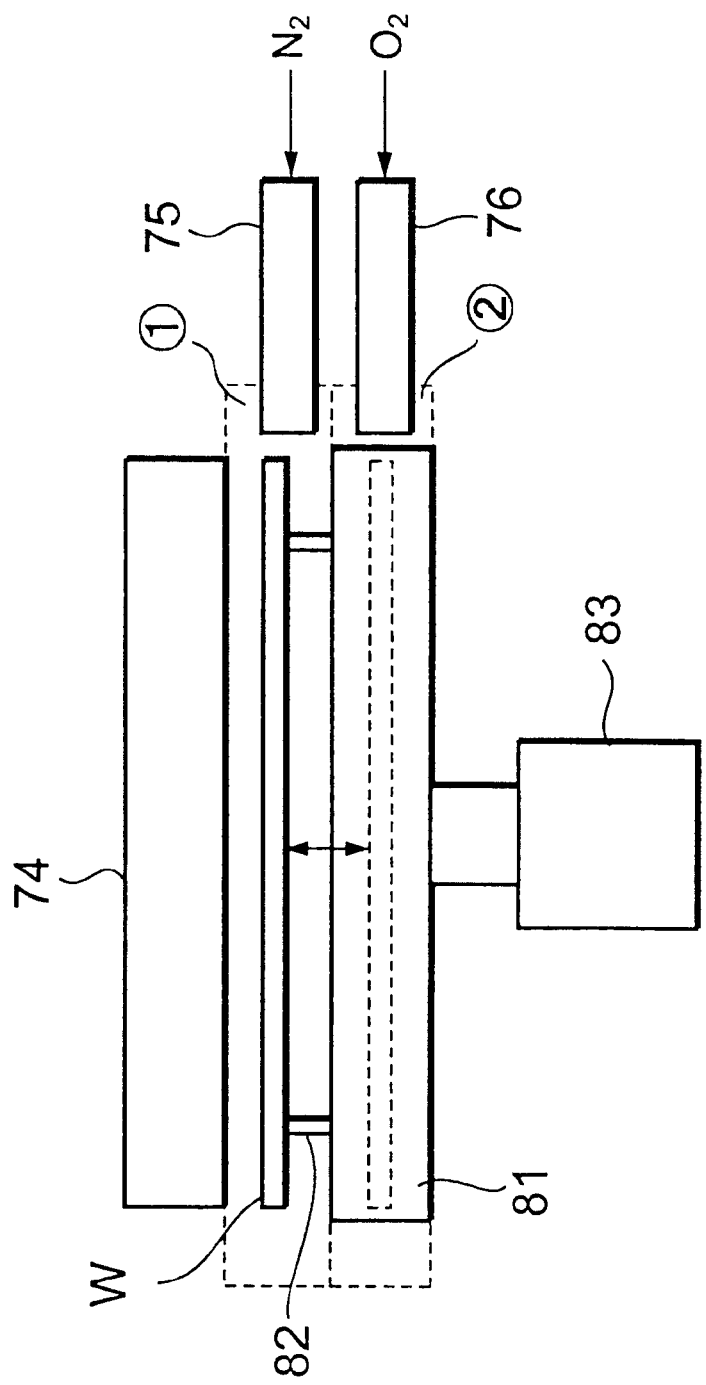
FIG. 8 is a front view showing the structure of an ultraviolet-ray processing station according to a third embodiment of the present invention.

It should be noted that in the second embodiment, the support pins 72 are raised and lowered to thereby move the wafer W between the first area ① and the second area ②. However, it is also suitable to configure that support pins 82 provided at a holding plate 81 are fixed and the holding plate 81 itself is raised and lowered by a vertically driving mechanism 83 as shown in FIG. 8 as a third embodiment. In FIG. 8, the same numerals and symbols are given to the same components as those shown in FIG. 7.

Next, a fourth embodiment of an ultraviolet-ray processing station according to the present invention will be explained.

Figure 9:
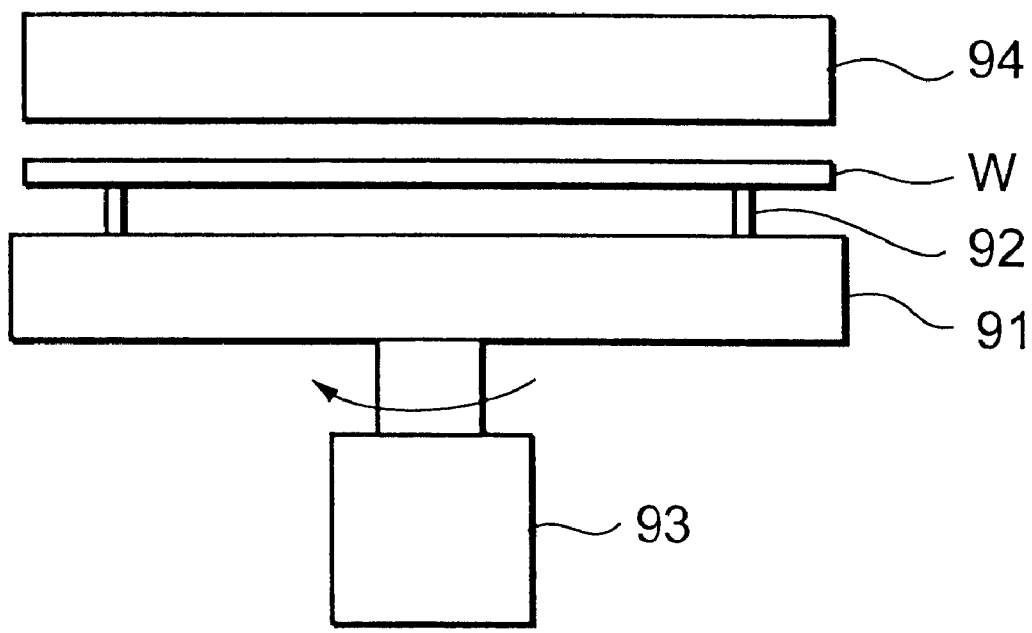
FIG. 9 is a front view showing the structure of an ultraviolet-ray processing station according to a fourth embodiment of the present invention.
Figure 10:
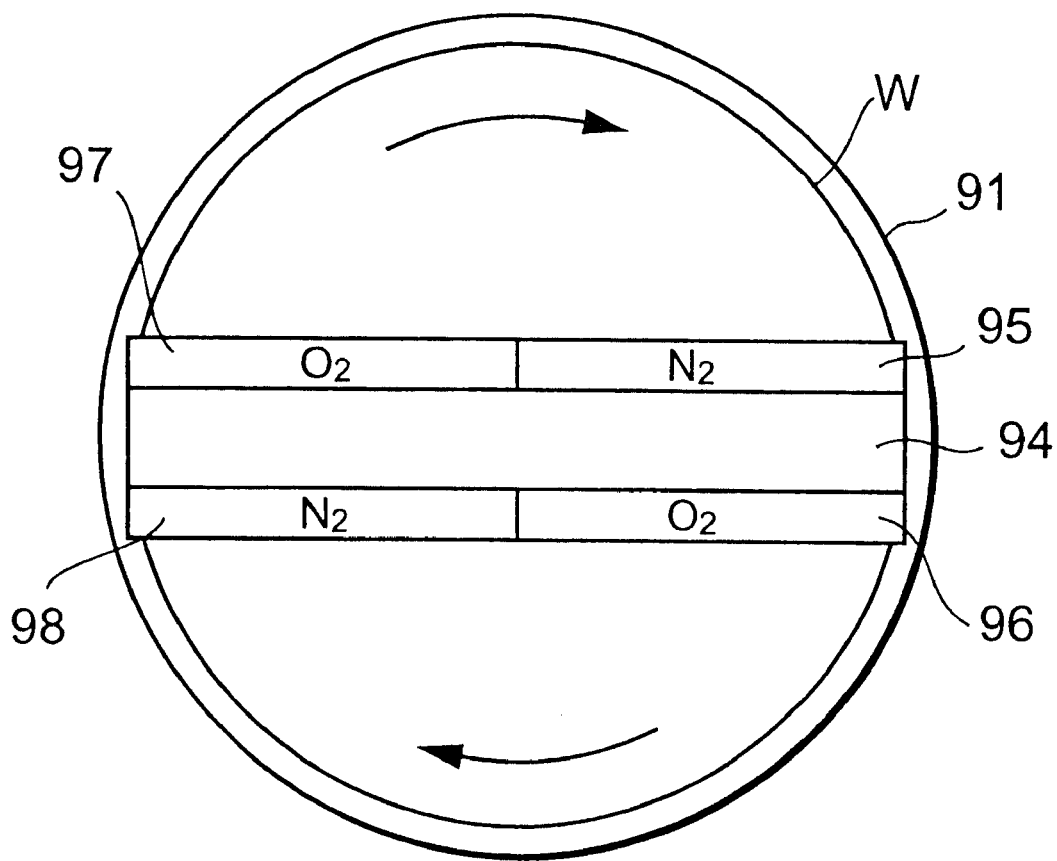
FIG. 10 is a plan view of the ultraviolet-ray processing station shown in FIG. 9.

FIG. 9 is a front view showing the structure of the ultraviolet-ray processing station (UV) according to the fourth embodiment, and FIG. 10 is a plan view thereof.

In the ultraviolet-ray processing station (UV) shown in these drawings, a holding plate 91 for holding the wafer W is disposed nearly at the center thereof. The holding plate 91 is provided with a plurality of, for example, three support pins 92. The holding plate 91 is rotated by means of a rotationally driving mechanism 93 which is disposed on the rear face side thereof.

Further, an oblong ultraviolet-ray irradiation lamp 94 is disposed above the holding plate 91 along a direction of a diameter of rotation of the holding plate 91.

An oblong nitrogen gas blast nozzle 95 as an inert gas blast portion for blasting nitrogen gas toward the front face of the wafer W held on the holding plate 91 is disposed along one radial direction from an area close to the center on one side of the ultraviolet-ray irradiation lamp 94, and an oblong oxygen gas blast nozzle 96 as an oxygen gas blast portion for blasting oxygen gas toward the front face of the wafer W held on the holding plate 91 is disposed along the aforesaid one radial direction from an area close to the center on the other side of the ultraviolet-ray irradiation lamp 94. Similarly, an oblong oxygen gas blast nozzle 97 for blasting oxygen gas toward the front face of the wafer W held on the holding plate 91 is disposed along the other radial direction from an area close to the center on the one side of the ultraviolet-ray irradiation lamp 94, and an oblong nitrogen gas blast nozzle 98 for blasting nitrogen gas toward the front face of the wafer W held on the holding plate 91 is disposed along the aforesaid other radial direction from an area close to the center on the other side of the ultraviolet-ray irradiation lamp 94.

When the holding plate 91 is rotated in a direction of arrows in FIG. 10, nitrogen gas is first blasted to the front face of the wafer W, whereby the front face of the wafer W is in a nitrogen gas atmosphere and then irradiated with ultraviolet rays. Thereafter, oxygen gas is blasted to the front face of the wafer W, whereby the front face of the wafer W is brought into an oxygen gas atmosphere, and oxygen radicals are generated. The holding plate 91 is continuously rotated, whereby the aforesaid operations are repeated. Consequently, according to this embodiment, the front face of the insulating film on the wafer can be efficiently made smaller in contact angle.

Next, a fifth embodiment of an ultraviolet-ray processing station according to the present invention will be explained.

Figure 13:
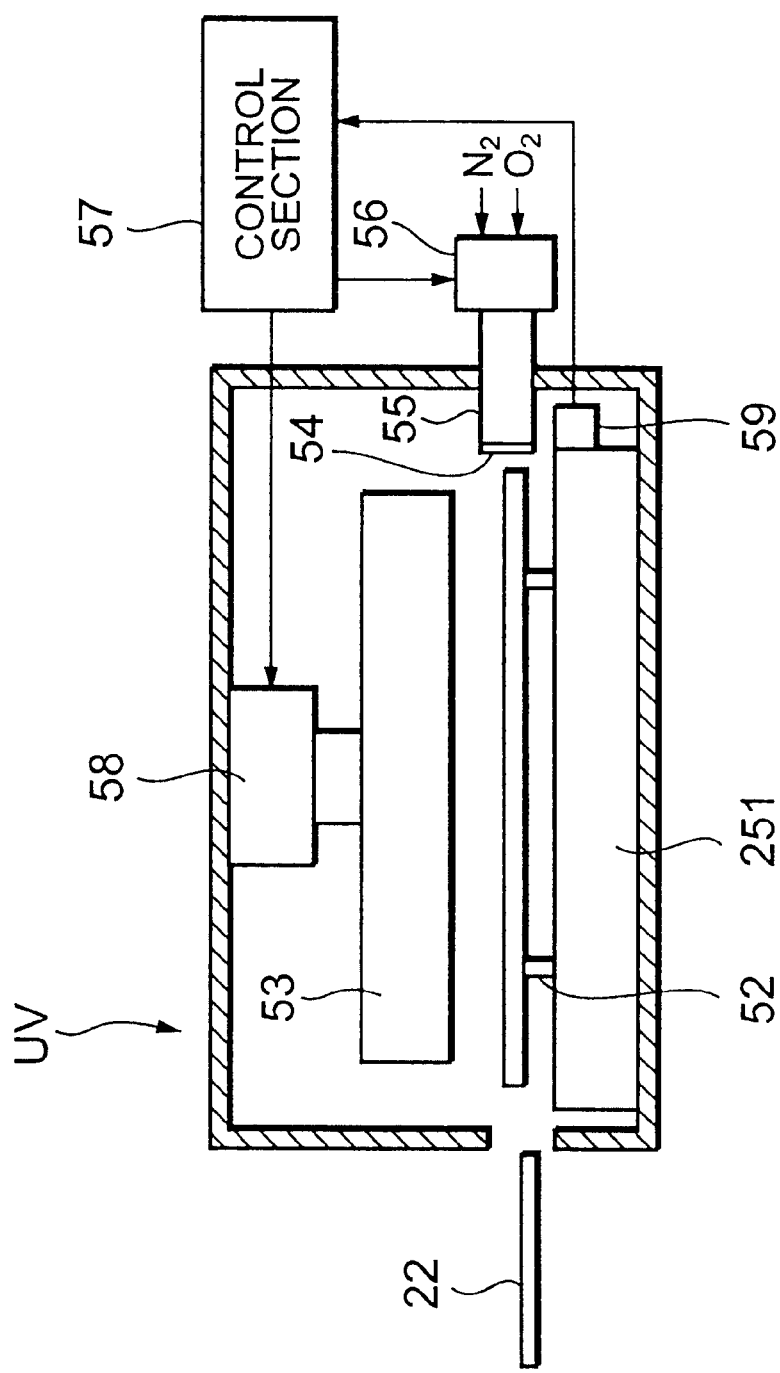
FIG. 13 is a front view showing the structure of an ultraviolet-ray processing station according to a fifth embodiment of the present invention.

FIG. 13 is a front view showing the structure of the ultraviolet-ray processing station (UV) according to the fifth embodiment.

In the ultraviolet-ray processing station (UV) according to the fifth embodiment, a hot plate 251 is used as the holding plate 51 of the ultraviolet-ray processing station (UV) according to the first embodiment. The hot plate 251 can be heated to a temperature of about 120° C., and the wafer W is mounted on the hot plate 251 which is set at a temperature of 120° C. while ultraviolet rays are applied to the wafer W in the fifth embodiment. The wafer W is irradiated with ultraviolet rays while heated as described above, whereby generation of oxygen radicals (O*) is accelerated more, with the result that a period of time of ultraviolet-ray irradiation can be reduced as compared with the first embodiment.

Next, a sixth embodiment according to the present invention will be explained.

In the first embodiment, the inside of the ultraviolet-ray processing station (UV) is brought to an oxygen gas atmosphere after a nitrogen gas atmosphere during ultraviolet-ray irradiation. In the sixth embodiment, the inside of the ultraviolet-ray processing station (UV) is brought to a mixed gas atmosphere made by mixture of 95% of nitrogen gas and 5% of oxygen gas during the ultraviolet-ray irradiation. The mixture ratio of an inert gas and oxygen gas is limited as described above, thereby keeping a propagation efficiency of ultraviolet rays good and efficiently making the front face of the insulating film smaller in contact angle without inhibiting generation of oxygen radicals (O*). Accordingly, the operation of switching the atmosphere in the ultraviolet-ray processing station (UV) during ultraviolet-ray irradiation as in the first embodiment becomes unnecessary, resulting in improved operating efficiency. Further, a period of processing time in the ultraviolet-ray processing station (UV) is 1 minute 40 seconds in the first embodiment, but it can be reduced to 1 minute 10 seconds in the sixth embodiment.

Next, a seventh embodiment according to the present invention will be explained.

In the first embodiment, the inside of the ultraviolet-ray processing station (UV) is set to be switched to an oxygen gas atmosphere after a nitrogen gas atmosphere during ultraviolet-ray irradiation. In the seventh embodiment, the atmosphere in the ultraviolet-ray processing station (UV) is set such that oxygen gas therein is gradually increased. For example, the setting is made such that nitrogen gas is supplied into the ultraviolet-ray processing station (UV) at the time of start of ultraviolet-ray irradiation, a mixed gas of nitrogen gas and oxygen gas is supplied into the ultraviolet-ray processing station (UV) with oxygen gas being gradually increased with time, and the mixture ratio of the mixed gas becomes a ratio of 95% of nitrogen gas to 5% of oxygen gas at the time of completion of the ultraviolet-ray irradiation. Ultraviolet rays are applied with oxygen gas being gradually increased as above, whereby when the inside of the ultraviolet-ray processing station (UV) is exchanged for a nitrogen gas atmosphere after the ultraviolet-ray irradiation, a period of time for purging nitrogen gas can be shortened.

Next, an eighth embodiment according to the present invention will be explained.

The ultraviolet-ray processing station (UV) is provided to perform ultraviolet-ray processing in the first embodiment. However, it is possible to provide ultraviolet-ray irradiation means in the cooling processing chamber in the low-oxygen curing and cooling processing station (DCC) and to perform the ultraviolet-ray processing which is performed in the step 606 in the cooling processing chamber in the low-oxygen curing and cooling processing station (DCC).

Figure 14:
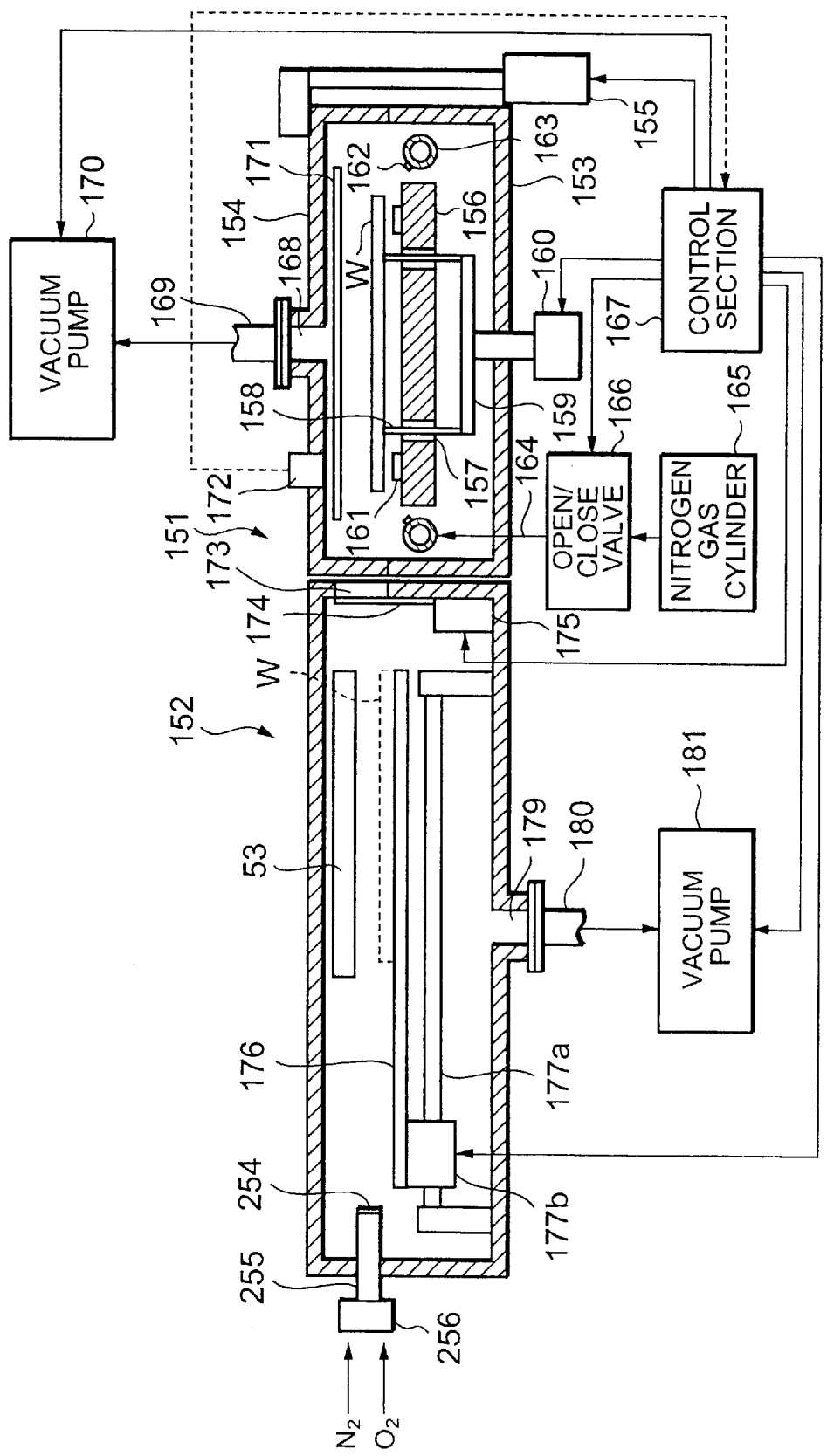
FIG. 14 is a sectional view of a low-oxygen curing and cooling processing station according to an eighth embodiment of the present invention.

FIG. 14 is a sectional view of a low-oxygen curing and cooling processing station (DCC) according to the eighth embodiment. In FIG. 14, an ultraviolet-ray irradiation lamp 53 is disposed above a chill plate 176 in a cooling processing chamber 152 of the low-oxygen curing and cooling processing station (DCC). Further, a blast pipe 255 including a blast port 254 for blasting gas toward a clearance between the chill plate 176 and the ultraviolet-ray irradiation lamp 53 is disposed. A switching valve 256 is connected to the blast pipe 255. The switching valve 256 performs switching for supplying one of nitrogen gas as an inert gas and oxygen gas which is supplied from an oxygen gas cylinder to the blast pipe 255 under the control of the control section.

The ultraviolet-ray irradiation means is provided in the cooling processing chamber of the low-oxygen curing and cooling processing station (DCC), whereby processing in the step 606 and the step 613 can be performed in the same station.

Nitrogen gas is used as an inert gas in the aforesaid embodiments, but argon gas or the like can also be used. Attenuation of ultraviolet rays which propagate in gas is smaller and energy efficiency is better in the case where argon gas is used than in the case where nitrogen gas is used.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A substrate processing method, comprising the steps of:

applying an insulating film material on a substrate;

performing processing by ultraviolet rays for a front face of the applied insulating material, the ultraviolet rays being applied to the front face of the applied insulating film material in an inert atmosphere and thereafter in an oxygen atmosphere switched from the inert gas atmosphere; and further applying an insulating film material on the applied insulating film material after the ultraviolet-ray processing step.

2. The method as set forth in claim 1, wherein the oxygen atmosphere is an atmosphere with an oxygen content of 5% or more.

3. The method as set forth in claim 1, wherein heat processing is performed for the substrate after said insulating film material coating step and before said ultraviolet-ray processing step, and wherein cooling processing is performed for the substrate after said ultraviolet-ray processing step and before said further insulating film material coating step.

4. The method as set forth in claim 1, wherein the oxygen is contained 5% in the mixed gas.

5. The method as set forth in claim 1, wherein the ultraviolet-ray processing step is performed under an atmosphere of which oxygen content is gradually increased.

6. The method as set forth in claim 1, wherein heat processing is being performed for the substrate during said ultraviolet-ray processing step.

7. A substrate processing method, comprising the steps of:

applying an insulating film material on a substrate; and applying ultraviolet rays to a front face of the insulating film material in an inert gas atmosphere; and thereafter in an oxygen atmosphere switched from the inert gas.

8. A substrate processing method, comprising the steps of:

applying an insulating film material on a substrate;

applying ultraviolet rays to a front face of the insulating film material in a processing chamber with an inert gas atmosphere; thereafter applying ultraviolet rays to the front face of the insulating film material under an atmosphere in the processing chamber into which oxygen has been allowed to flow; and bringing the inside of the processing chamber to an inert gas atmosphere.

9. A substrate processing method, comprising the steps of:

applying an insulating film material on a substrate;

performing processing by ultraviolet rays for a front face of the applied insulating film material, the ultraviolet rays being applied to the front face of the applied insulating film material in mixed gas atmosphere in which an inert gas and oxygen are mixed; and further applying an insulating film material on the applied insulating film material after the ultraviolet-ray processing step.

10. The substrate processing method as set forth in claim 1, wherein the ultraviolet rays is applied to the front face of the applied insulating material in the inert gas atmosphere while the substrate is held in a first area and thereafter in the oxygen atmosphere while the substrate is held in a second area lower than the first area.

11. The substrate processing method as set forth in claim 9, wherein the ultraviolet rays is applied to the front face of the applied insulating material in the inert gas atmosphere while the substrate is held in a first area and thereafter in the oxygen atmosphere while the substrate is held in a second area lower than the first area.

* * * * *